United States Patent [19]

Shirato et al.

[11] Patent Number: 5,031,018
[45] Date of Patent: Jul. 9, 1991

[54] BASIC CELL OF GATE ARRAY DEVICE

[75] Inventors: Takehide Shirato, Hiratsuka; Teruo Tazunoki, Kawasake, both of Japan

[73] Assignee: Fujitsu Limited, Kawasaki, Japan

[21] Appl. No.: 166,488

[22] Filed: Mar. 10, 1988

[30] Foreign Application Priority Data

Mar. 13, 1987 [JP] Japan .................................. 62-59476

[51] Int. Cl.$^5$ ...................... H01L 27/02; H01L 27/10; H01L 27/15; H01L 23/00
[52] U.S. Cl. ......................................... 357/42; 357/41; 357/45
[58] Field of Search ................... 357/23.14, 42, 41, 43, 357/15 M, 15 R, 45

[56] References Cited

U.S. PATENT DOCUMENTS

| | | | |
|---|---|---|---|
| 4,430,583 | 2/1984 | Shoji | 357/23.14 |
| 4,622,567 | 11/1986 | Pals et al. | 357/23.14 |
| 4,672,584 | 6/1987 | Tsuji et al. | 357/42 X |
| 4,701,777 | 10/1987 | Takayama et al. | 357/42 |
| 4,760,035 | 7/1988 | Pfleiderer et al. | 357/42 X |

FOREIGN PATENT DOCUMENTS 0136880 4/1985 European Pat. Off. .
58-51939 3/1983 Japan .

Primary Examiner—Rolf Hille
Assistant Examiner—Mahshid Saadat
Attorney, Agent, or Firm—Staas & Halsey

[57] ABSTRACT

A basic cell of a gate array device comprises a substrate, a plurality of source/drain diffusion regions being formed in the substrate, at least one gate electrode being located between the adjacent source/drain diffusion regions, a substrate contact region being formed in the substrate and being located in the vicinity of the source/drain diffusion regions, and an insulation film being provided on the source/drain regions and the gate electrode and being provided with contact hole forming regions at which contact holes are to be formed so as to form a plurality of interconnecting channels for making an electric connection between desired regions. Each of the source/drain diffusion regions adjacent to the substrate contact region has a narrower portion located under one interconnecting channel specifically for making one substrate contact and a wider portion located under the other interconnecting channels.

10 Claims, 7 Drawing Sheets

BASIC CELL OF GATE ARRAY DEVICE

BACKGROUND OF THE INVENTION

The present invention generally relates to basic cells of gate array devices, and in particular to improvements in a relationship between source/drain diffusion regions and electrode contact holes formed in insulating films formed on the diffusion regions.

A gate array device is an integrated circuit device formed on a a semiconductor chip on which a plurality of basic cells, which are formed by a production process common to all gate array devices, are arranged in the form of matrix. Each basic cell is configured by transistors, diodes, resistors and so on. An interconnecting (or wiring) process is carried out for the basic cells to build desired logic elements and circuits in accordance with designers, specifications.

Most conventional gate array devices are configured by complementary metal oxide semiconductor (hereafter simply referred to as CMOS) transistors. The gate array device of this type is known as a CMOS gate array device. Each of the basic cells contains an n-channel element region and a p-channel element region. For example, the n-channel element region has a p-type well region formed in an n-type silicon substrate. In the p-type well region, there are formed n+-type diffusion regions which are source/drain (hereafter simply referred to as S/D) regions. The n+-type diffusion regions related to one basic cell are located between adjacent p+-type substrate contact regions formed in the p-type well region. One or more gate electrodes are arranged on a gate insulating film and between the adjacent S/D diffusion regions. On the other hand, p+-type diffusion regions related to one basic cell are formed in the n-type silicon substrate, and are located between adjacent n+-type substrate contact regions formed in the n-type substrate. The gate electrodes are provided on the gate insulating film and between the adjacent S/D diffusion regions.

The S/D regions and the substrate contact regions may be coupled with each other to form desired elements such as CMOS inverters and to make a substrate contact for coupling the S/D regions with the substrate. Conventionally, a plurality of interconnecting (wiring) channels on which interconnecting lines are arranged, are provided for each basic cell. These interconnecting channels extend in a direction of a column composed of basic cells. Actually, the interconnecting lines are laid on an insulating film deposited on the S/D diffusion regions and the gate electrodes. The interconnecting lines mutually connect the S/D regions and substrate contact regions through contact holes formed in the insulating film deposited thereon. The contact holes are filled with material forming the interconnecting lines. The contact holes are formed at predetermined positions on the S/D regions and the substrate contact regions.

However, the conventional basic cells of the gate array device of the above structure have the following disadvantages. As is known, it is very difficult to accurately form the contact holes at predetermined positions. In other words, it is frequently observed that the contact holes are formed in a state where they deviate from the predetermined positions. For example, when contact holes for making the electric contact with the S/D diffusion regions adjacent to the substrate contact regions are formed partially beyond the S/D diffusion regions, a surface portion of the substrate becomes exposed through the contact holes. In this case, when an interconnecting line which is not designed to be coupled with the substrate contact region is provided over the above contact holes, a short circuit occurs between the exposed substrate surface portion and the above S/D diffusion region via the interconnecting line. This problem becomes greater as the integration density increases. In order to prevent the short circuit, a compensated impurity diffusing process must be carried out for the exposed surface portion of the substrate. However, the compensated impurity diffusing process is complex and cumbersome, and takes a long time, because it consists of steps for masking, ion implantation, removal of the resist film, and annealing.

In addition, the conventional basic cell is designed so that the substrate contact can be built by using any one of the plurality of interconnecting channels. For this purpose, the substrate contact regions are formed so as to have the width sufficient to form contact holes at any positions thereof. This prevents an increased integration density from being obtained.

SUMMARY OF THE INVENTION

Accordingly, a general object of the present invention is to provide a novel and useful basic cell of a gate array device in which the disadvantages of the conventional basic cell have been eliminated.

A more specific object of the present invention is to provide a basic cell of a gate array device in which the compensated impurity diffusing process is unnecessary even if the positional displacement of contact holes occurs.

Another object of the present invention is to provide a basic cell of a gate array device in which the integration density can be improved.

The above objects of the present invention can be achieved by a basic cell of a gate array device comprising a substrate, a plurality of source/drain diffusion regions being formed in the substrate, at least one gate electrode being located between the adjacent source/drain diffusion regions, a substrate contact region being formed in the substrate and being located in the vicinity of the source/drain diffusion regions, and an insulating film being provided on the source/drain regions and the gate electrode and being provided with contact hole forming regions at which contact holes are to be formed so as to form a plurality of interconnecting channels for making an electric connection between desired regions. Each of the source/drain diffusion regions adjacent to the substrate contact region has a narrower portion located under one interconnecting channel specifically for making a substrate contact and a wider portion located under the other interconnecting channels.

Other objects, features and advantages of the present invention will become apparent from the following detailed description when read in conjunction with the accompanying drawings.

DETAILED DESCRIPTION

Figure 1:
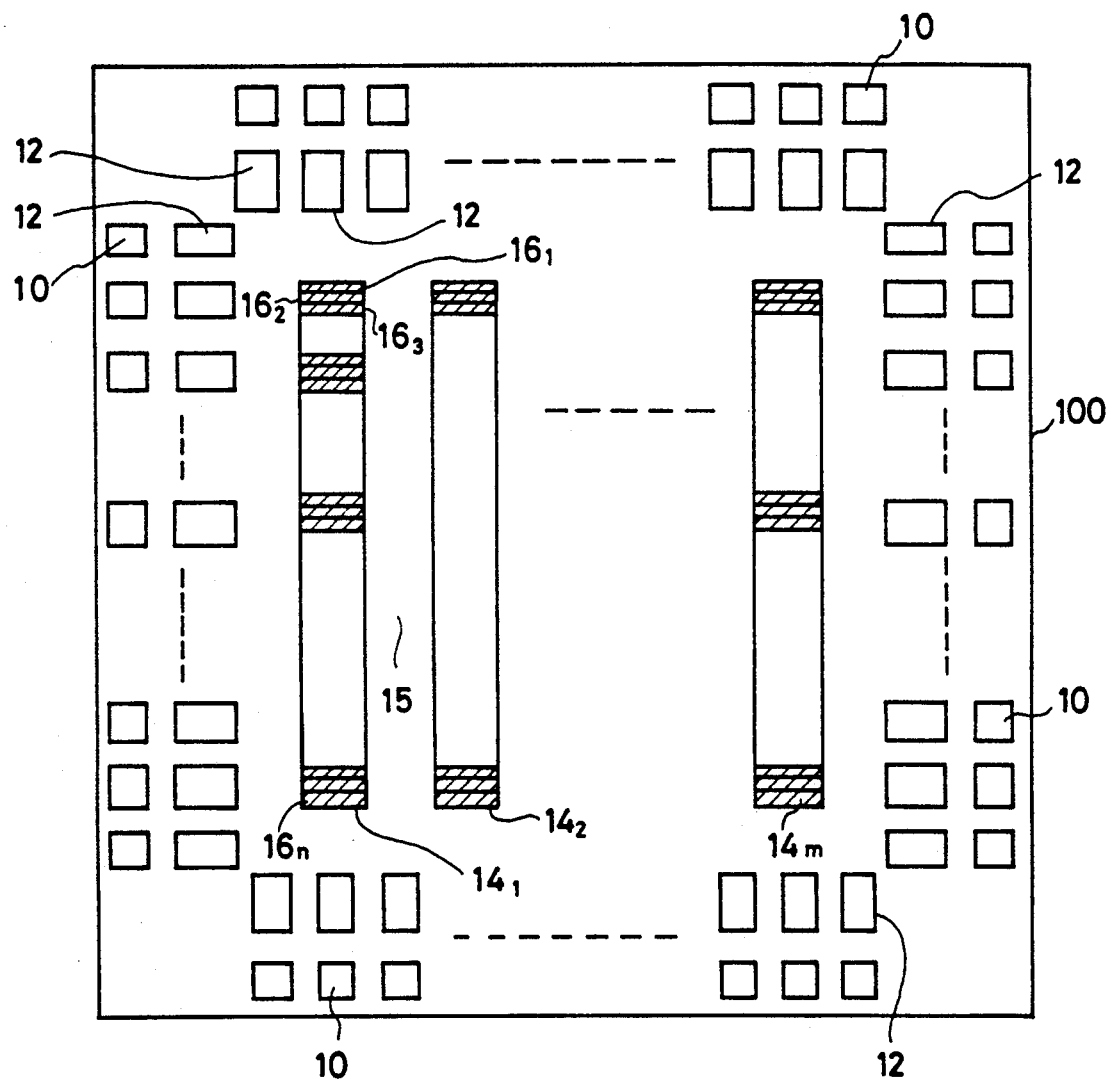
FIG. 1 is a plan view of a semiconductor chip of a gate array device.

Referring to FIG. 1, a plurality of bonding pads 10 are arranged in the peripheral region of a semiconductor chip 100 of a gate array device. A plurality of input-/output cells (hereafter simply referred to as I/O cells) 12 are arranged in the peripheral region of the chip 100 and inside the arrangement of the bonding pads 10. A plurality of basic cell columns $14_1$, $14_2$, ..., $14_m$ are arrayed in an inner surface area of the chip 100 surrounded by the arrangement of the I/O cells 12. Each of the basic cell columns $14_1$, $14_2$, ..., $14_m$ consists of a number of basic cells $16_1$, $16_2$, $16_3$, ..., $16_n$. The interconnecting (wiring) process has not yet been performed on the semiconductor chip 100 depicted in FIG. 1. The interconnecting process is carried out in accordance with specifications by individual users or designers. Spacings 15 between the adjacent basic cell columns are used to arrange buses carrying various signals.

Figure 2:
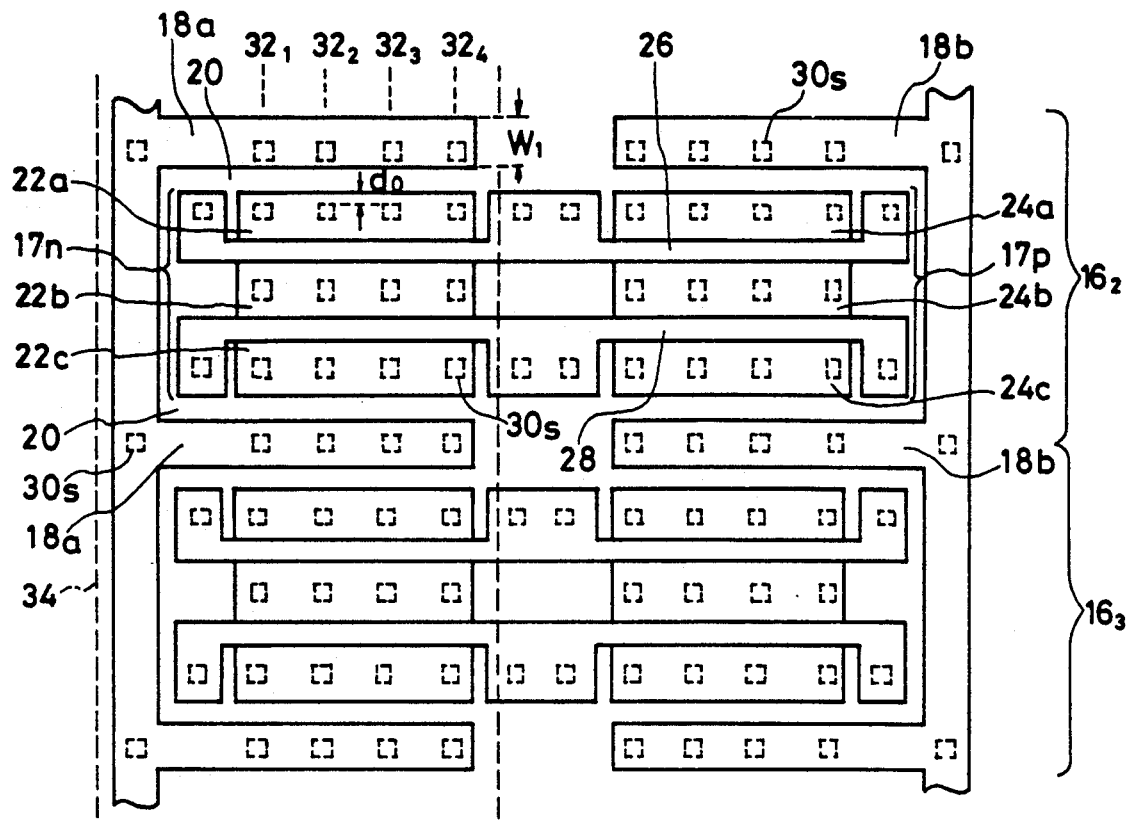
FIG. 2 is an enlarged plan view of conventional basic cells employed in a conventional gate array device.

FIG. 2 illustrates only two conventional basic cells $16_2$ and $16_3$ out of the basic cells $16_1$ through $16_m$ shown in FIG. 1. The two basic cells $16_2$ and $16_3$ are adjacent to each other in a direction of the column $14_1$. As illustrated, each of the basic cells comprises an n-channel element region 17n and a p-channel element region 17p. Two n-channel transistors can be formed in the n-channel element region 17n. Likewise, two p-channel transistors can be formed in the p-channel element region 17p.

Adjacent n-channel element regions 17n are separated from each other by one p$^+$-type well contact region 18a. Similarly, adjacent p-channel element regions 17p are separated from each other by one n$^+$-type substrate contact region 18b. Hereafter, each of the p$^+$-type well contact regions 18a and the n$^+$-type substrate contact regions 18b is referred to as a substrate contact region. The substrate contact regions 18a are mutually coupled as shown in FIG. 2 so that one substrate contact region of a comb shape made of the plural p$^+$-type well contact regions is formed. Likewise, the substrate contact regions 18b are mutually coupled, so that one substrate contact region of a comb shape made of the plural n$^+$-type contact regions is formed. The substrate contact regions 18a and 18b oppose each other.

Three source/drain (hereafter simply referred to as S/D) diffusion regions 22a, 22b and 22c are provided between the adjacent substrate contact regions 18a. The S/D diffusion regions 22a and 22c are separated from the substrate contact regions 18a by a field oxide film 20. In addition, the S/D diffusion regions 22a, 22b and 22c are separated from each other by a predetermined distance. The substrate contact regions 18a and the S/D diffusion regions 22a, 22b and 22c are formed in a p-type well region 34 (shown in FIG. 3B) which is formed in an n-type silicon substrate 40. Similarly, three S/D diffusion regions 24a, 24b and 24c are provided between the adjacent substrate contact regions 18b. The substrate contact regions 18b and the S/D diffusion regions 24a, 24b and 24c are formed in the n-type silicon substrate 40.

A gate electrode 26 is provided on a gate insulating film 44 (shown in FIG. 3B) and between the adjacent S/D diffusion regions 22a and 22b formed in the n-channel element region 17n as well as between the adjacent S/D diffusion regions 24a and 24b formed in the p-channel element region 17p. Another gate electrode 28 is provided on the gate insulating film 44 and between the adjacent S/D diffusion regions 22b and 22c formed in the n-channel element region 17n as well as between the adjacent S/D diffusion regions 24b and 24c formed in the p-channel region 17p. An insulating film composed of insulating films 46 and 48 (shown in FIG. 3B), is deposited on the substrate contact regions 18a and 18b, the S/D diffusion regions 22a to 22c and 24a to 24c, and the gate electrodes 26 and 28. A plurality of contact hole forming regions 30s are predetermined at portions of the insulating film, composed of the laminated insulating films 46 and 48, at which contact holes are to be formed. The contact hole forming regions 30s are positioned so as to form or define four interconnecting channels $32_1$ through $32_4$, which extend in the direction of the basic column $14_1$. One or more corresponding interconnecting lines can be deposited on the interconnecting channels $32_1$ to $32_4$, which are electrically coupled with the desired regions such as the S/D diffusion regions through contact holes formed at the positions 30s. Additionally, an interconnecting line which is specifically used to connect one or more predetermined S/D diffusion regions to the substrate contact regions 18a and 18b, is provided by use of any one of the four interconnecting channels $32_1$ and $32_4$. Therefore, the substrate contact regions 18a and 18b are made uniformly wide enough to form the contact holes at the contact hole forming regions 30s within a tolerance for positional displacement of the contact holes. For example, each of the contact hole forming regions 30s has a size of approximately 2 ($\mu$m)×2 ($\mu$m), and each of the substrate contact regions 18a and 18b is approximately 4 ($\mu$m) in width.

Figure 3A:
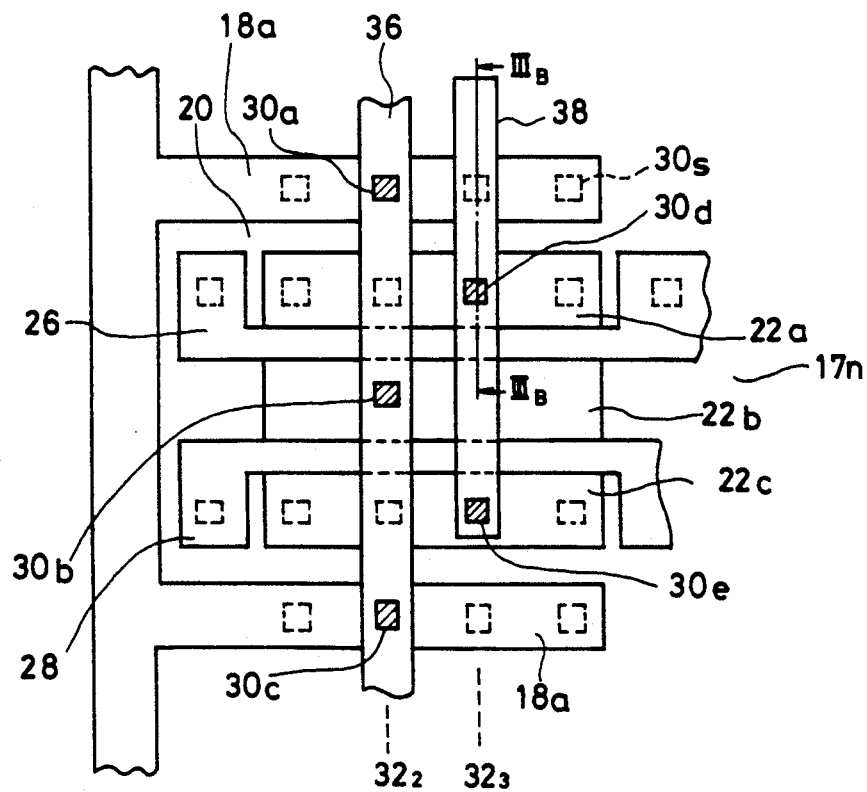
FIG. 3A is an enlarged plan view of an n-channel element region of the basic cells shown in FIG. 2.

FIG. 3A shows an example of an interconnecting pattern which may be provided for the n-channel element region 17n. In the illustrated example, the S/D diffusion regions 22a and 22c adjacent to the substrate contact regions 18a are utilized as drain regions. An aluminum (Al) interconnecting line 36 for making the substrate contact is provided on the second interconnecting channel $32_2$. The interconnecting line 36 for the substrate contact is electrically connected to the substrate contact regions 18a through contact holes 30a and 30c and to the S/D diffusion region 22b through a contact hole 30b. In this example, the S/D diffusion region 22b is used as a source region. The contact holes 30a to 30b are formed by the window forming process. Another Al interconnecting line 38 for connecting the drain regions 22a and 22c to a desired region or regions is provided on the third interconnecting channel $32_3$. The interconnecting line 38 is electrically connected to the drain regions 22a and 22c through contact holes 30d and 30e.

Figure 3B:
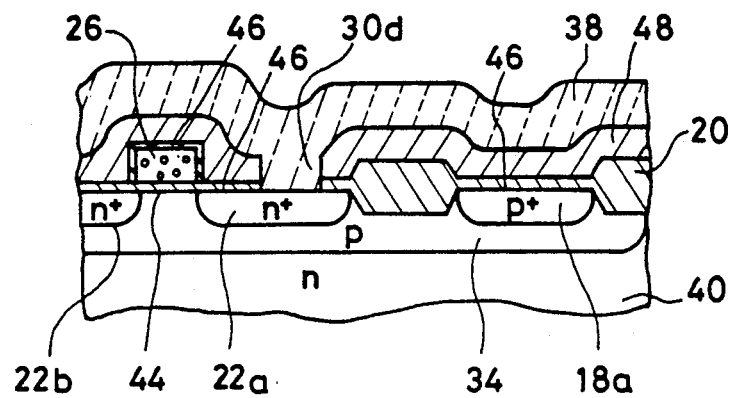
FIG. 3B is an elevational cross sectional view taken along a line III$_B$—III$_B$ shown in FIG. 3A, in which the positional displacement of a contact hole does not occur.

FIG. 3B shows an elevational cross section taken along a line $III_B$—$III_B$ shown in FIG. 3A. FIG. 3B refers to a case where the positional displacement of contact holes with respect to the predetermined positions does not occur. The p-type well region 34 is formed in the n-type silicon substrate 40 by the diffusion process. As described before, most of the available gate array devices are CMOS gate array devices. In the CMOS gate array devices, n-channel MOS transistors are formed in the p-type well region 34, and p-channel MOS transistors are formed in the surface portion of the n-type substrate 40. The n-channel and p-channel MOS transistors may be coupled with each other to form CMOS transistors. In the example shown in FIG. 2, each of the basic cells $16_2$ and $16_3$ can provide two CMOS transistors.

A surface portion of the n-type silicon substrate 40 on which the gate electrode 26 is to be formed is subjected to the heat treatment process, so that the gate insulating film 44 made of silicon dioxide ($SiO_2$) for example is formed. The gate electrode 26 made of polysilicon for example, is provided on the gate insulating film 44. The n-type ion implanting and diffusing process is carried out for the p-type well region 34 in accordance with the self-alignment in which the gate electrode 26 functions as the mask. By this process, the S/D diffusion regions 22a to 22c are formed. Subsequently, the substrate contact regions 18a which are the $p^+$-type diffusion regions are formed by the p-type ion implanting and diffusing process. Thereafter, the surface of the gate electrode 26, surface portions of each of the S/D diffusion regions 22a to 22c, and the substrate contact regions 18a are coated by the insulating film 46 made of $SiO_2$ for example. Subsequently, the insulating film 48 made of phospho-silicate glass (hereafter simply referred to as PSG) for example, is provided on an entire surface of the structure.

Following the deposition of the PSG film 48, the contact holes 30a to 30e are formed in the laminated insulating films 46 and 48 on the S/D diffusion regions 22a, 22b and 22c and the substrate contact regions 18a by the window opening process. Subsequently, aluminum is deposited and patterned. As a result, the Al connecting line 36 on the second channel $32_2$ is formed on the insulating film 48 so as to cover the contact holes 30a, 30b and 30c. Likewise, the Al interconnecting line 38 on the third channel is formed on the insulating film 48 so as to the cover the contact holes 30d and 30e.

At the time of its use, a reference potential of 0 (v) for example is applied to the substrate contact regions 18a and the source region 22b, whereas a positive potential of 5 (v) for example is applied to the drain regions 22a and 22c. In this use, no serious problem occurs in the case where the window opening for forming the contact holes has been accurately carried out and the contact holes 30d and 30e are positioned within the drain regions 22a and 22c, respectively. On the other hand, a problem of the short circuit occurs between the drain regions 22a and 22c and the p-type well region 34, in the case where any one of the contact holes 30d and 30e is positioned partially beyond the respective drain regions 22a and 22c.

Figure 3C:
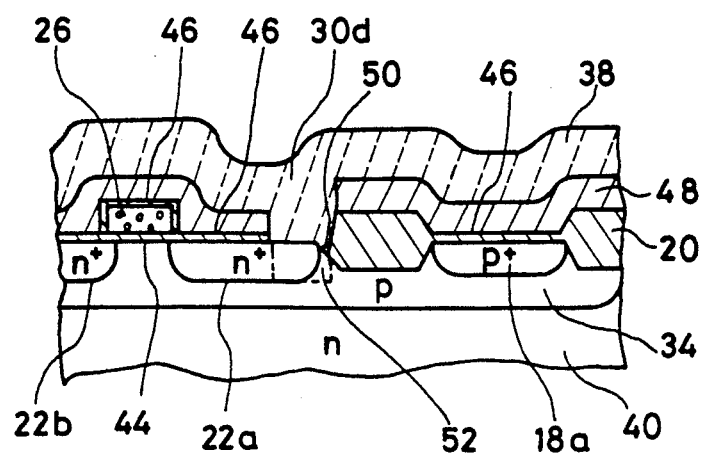
FIG. 3C is an elevational cross sectional view taken along a line III$_B$—III$_B$ shown in FIG. 3A, in which the positional displacement of the contact hole occurs.

The above problem is now described in detail, by referring to FIG. 3C which shows an elevational cross sectional view taken along the line $III_B$—$III_B$ shown in FIG. 3A. FIG. 3C shows the same configuration as that shown in FIG. 3B except for the position of the contact hole 30d. In general, as shown in FIG. 2, a distance $d_O$ is provided between the edges of the contact hole forming regions 30s in the S/D diffusion region 22a adjacent to the substrate contact region 18a and the edge of the S/D diffusion region 22a. The distance $d_O$ decreases with an increase in the integration density of the gate array. As shown in FIG. 3C, when the positional displacement of the contact hole 30d over the distance $d_O$ occurs, a surface portion 50 on the p-type well region 34 may become exposed. Therefore, the exposed well surface portion 50 is brought into contact with the interconnecting line 38. As a result, the short circuit is caused between the drain regions 22a and 22c and the p-type well region 34 via the interconnecting line 38. This short circuit may cause an erroneous operation of the circuit configured by the basic cells. In order to prevent the occurrence of the short circuit due to the positional displacement of the contact holes, the compensated impurity diffusing process is employed. Impurities of the n-type are implanted through the exposed surface portion 50 and are diffused into the p-type well region 34. A reference numeral 52 denotes the compensated $n^+$-type diffusion region. However, as described previously, the compensated impurity implanting and diffusing process is complex and cumbersome. With regard to the interconnecting line 36 for making the substrate contact, the problem of the short circuit does not arise, because the S/D diffusion regions 22a and 22c adjacent to the substrate contact regions 18a are not designed to be provided with any contact holes.

Figure 4A:
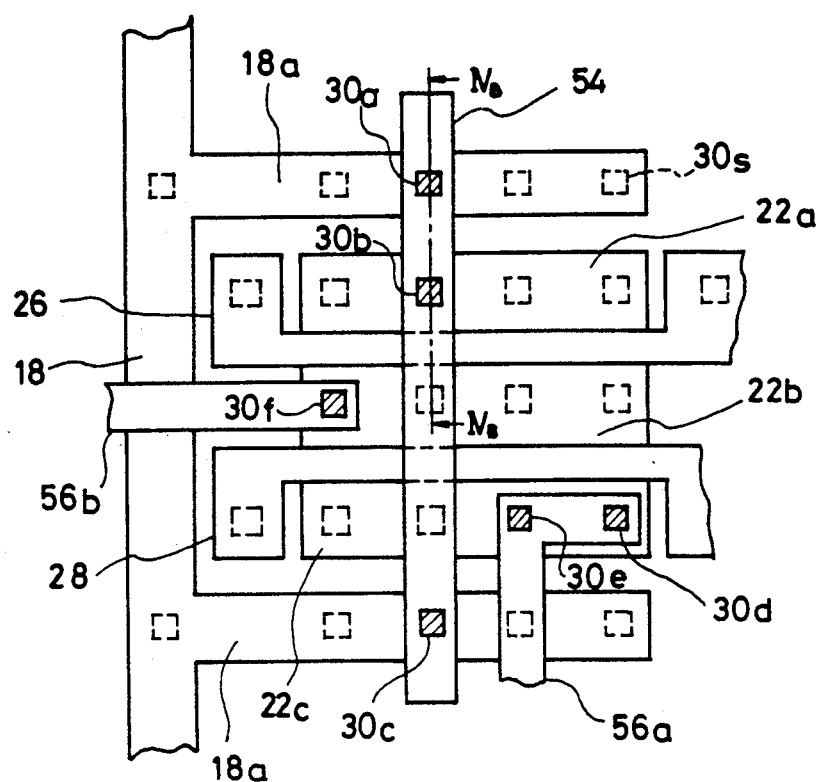
FIG. 4A is an enlarged plan view of an n-channel element region of the basic cells shown in FIG. 2, in which interconnecting lines different from those shown in FIG. 2 are provided.

FIG. 4A shows a different interconnecting pattern in which the S/D diffusion regions 22a and 22c are used as the source regions, and the S/D diffusion region 22b is used as the drain region. As shown, an Al interconnecting line 54 for making the substrate contact is provided on the second interconnecting channel $32_2$ shown in FIG. 2. The interconnecting line 54 is electrically connected to the substrate contact regions 18a through the contact holes 30a and 30c. In the illustrated structure, the source region 22a is designed to be set to a potential identical to that of the p-type substrate contact regions 18a. For this reason, the contact holes 30a and 30c are formed at the contact hole forming regions 30s located under the second interconnecting line $32_2$. The interconnecting line 54 for making the substrate contact connects the source region 22a to the substrate contact regions 18a through the contact hole 30b.

The other source region 22c is designed to be used at a potential different from that of the p-type well region 34. For this reason, the source region 22c is not coupled with the interconnecting line 54 and is coupled with another interconnecting line 56a through the contact holes 30d and 30e. As illustrated, still another interconnecting line 56b is extended from the drain region 22b connected thereto through a contact hole 30f.

Figure 4B:
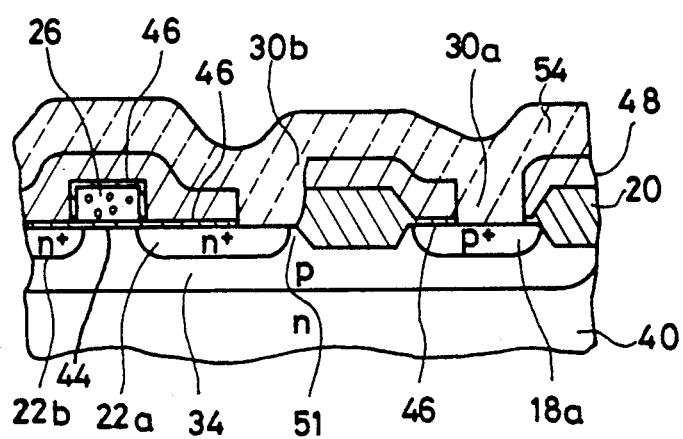
FIG. 4B is an elevational cross sectional view taken along a line IV$_B$—IV$_B$ shown in FIG. 4A.

An elevational cross sectional view taken along a line $IV_B$—$IV_B$ shown in FIG. 4A is shown in FIG. 4B. The illustrated structure has the contact hole 30b having the positional displacement beyond the source region 22a. An exposed well region 51 is formed due to the displacement of the contact hole 30b. However, it is noted that no problem arises in the structure shown in FIGS. 4A and 4B, because the substrate contact region 18a and the source region 22a are connected to each other by the interconnecting line 54, so that they are at the same potential.

Consequently, the S/D diffusion regions 22a and 22c which are adjacent to the substrate contact regions 18a, are provided with the contact holes under the interconnecting channel for the substrate contact, only when they are used as the source regions as in the case of FIG. 4A. In other words, when the S/D regions 22a and 22c adjacent to the substrate contact regions 18a are used as the drain regions as in the case shown in FIG. 3A, contact holes are not formed under the interconnecting channel for the substrate contact.

The above description refers to the n-channel element region 17n. It is noted that a problem like the above holds true for the p-channel element region 17p.

A description is now given of a preferred embodiment of the present invention.

Figure 5:
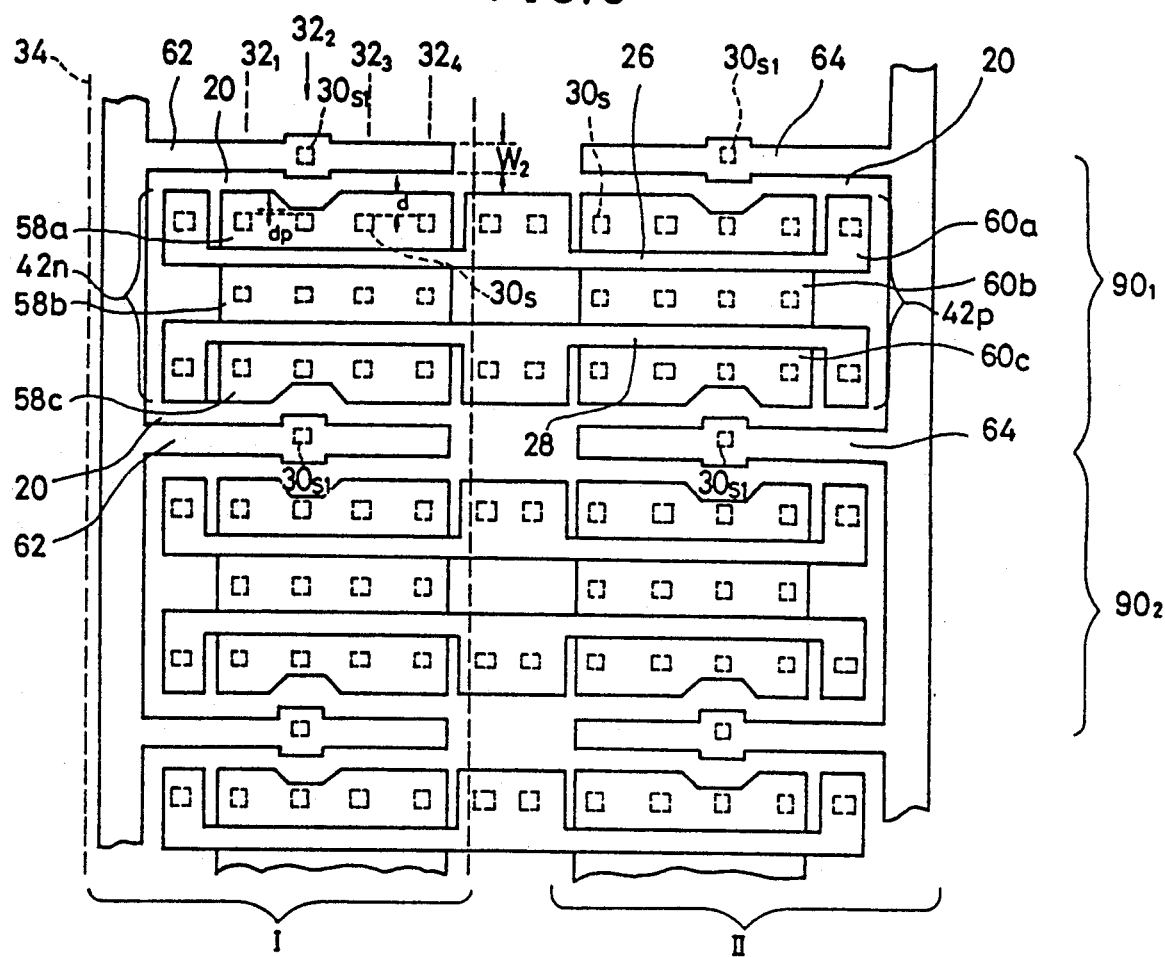
FIG. 5 is a plan view of a preferred embodiment of a basic cell of a gate array device according to the present invention.

FIG. 5 is a plan view of basic cells of a gate array device according to a preferred embodiment of the present invention. FIG. 5 shows two basic cells $90_1$ and $90_2$. A plurality of basic cells each having the structure shown in FIG. 5 are formed on the semiconductor chip 100 of FIG. 1 instead of the basic cells $16_1, 16_2, \ldots, 16_n$. Structural elements shown in FIG. 5 which are the same as those in the previous figures are represented by the same reference numerals.

Structural differences between the configurations shown in FIGS. 2 and 5 can be summarized as follows. On an n-channel side I, firstly, contact hole forming regions $30s_1$ located on substrate contact regions 62 are provided under only the second interconnection channel $32_2$. Secondly, the substrate contact regions 62 are made narrower at their portions other than a portion thereof under the second interconnecting channel 32 and under which the contact hole forming regions $30s_1$ are provided. In other words, each of the substrate contact regions 62 has a wider portion and narrower portions. Thirdly, a distance d between edges of S/D regions 58a and 58c and edges of the contact hole forming regions 30s under interconnecting channels, other than the second interconnecting channel $32_2$ only for the substrate contact, is made wider than a distance $d_p$ between edges of the contact hole forming regions 30s and edges of the S/D regions 58a and 58c under the second interconnecting channel $32_2$. In other words, the S/D diffusion regions 58a and 58c adjacent to the substrate contact regions 62 have wider portions and narrower portions. A p-channel side II having a substrate contact region 64 has features identical to those of the n-channel side I.

Figure 6A:
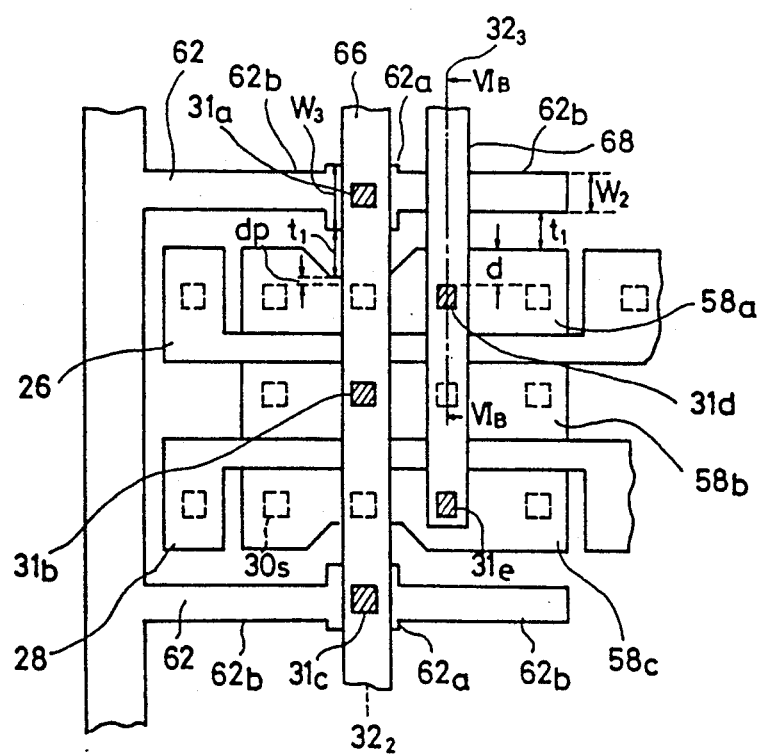
FIG. 6A is an enlarged plan view of an n-channel element region of the basic cell shown in FIG. 5.
Figure 6B:
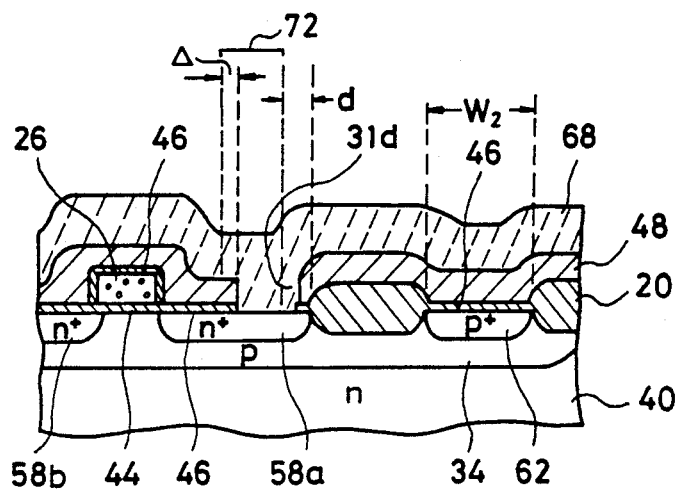
FIG. 6B is an elevational cross sectional view taken along a line VI$_B$—VI$_B$ shown in FIG. 6A.

A further description is now given of the preferred embodiment of the present invention, by referring to FIGS. 5, 6A and 6B.

The illustrated basic cell $90_1$ comprises a n-channel element region 42n and a p-channel element region 42p. Two adjacent n-channel element regions 42n are separated from each other by one substrate contact region 62 made of a p+-type diffusion region formed in the p-type well region 34. Two adjacent p-type element regions 42p are separated from each other by one substrate contact region 64 made of an n+-type diffusion region formed in the n-type substrate 40. Openings of the substrate contact regions 62 and 64 oppose each other. The substrate contact regions 62 are mutually connected by a p+-type diffusion region extending in the direction of the column so that one substrate contact region of a comb shape is formed. similarly, the substrate contact region 64 are mutually connected by an n+-type diffusion region extending in the direction of the column so that one substrate contact region of a comb shape is formed.

S/D diffusion regions 58a, 58b and 58c are provided between the adjacent substrate contact regions 62. The S/D diffusion regions 58a, 58b and 58c are formed by n+-type diffusion regions which are formed in the p-type well region 34. Adjacent S/D diffusion regions 58a, 58b and 58c are separated from each other by a predetermined distance. The substrate contact regions 62 and the S/D diffusion contact regions 58a and 58c adjacent thereto are separated from each other by the field insulating film 20. The gate electrode 26 is provided on the gate insulating film 44 and between the S/D diffusion regions 58a and 58b. Similarly, the gate electrode 28 is provided on the gate insulating film 44 and between the S/D diffusion regions 58b and 58c. The insulating film 46 made of $SiO_2$ for example, is formed on the surface of the gate electrodes 26 and 28, the surfaces of the S/D diffusion regions 58a, 58b and 58c and the substrate contact regions 62. The insulating film 48 is provided on the $SiO_2$ film 46 and the field oxide film 20. The contact hole forming regions 30s at which the contact holes are to be formed in the insulating film consisting of the laminated insulating films 46 and 48 are predetermined on the S/D diffusion regions 58a to 58c.

S/D diffusion regions 60a, 60b and 60c in the p-channel element region 42p are provided between the adjacent substrate contact regions 64. These S/D diffusion regions are separated from each other by a predetermined distance. The S/D diffusion regions 60a and 60c are separated from the substrate contact regions 64 by the field oxide film 20. The S/D diffusion regions formed in the n-type substrate 40. The gate electrode 26 is provided on the gate insulating film 44 and between the adjacent S/D diffusion regions 60a and 60b. Similarly, the gate electrode 28 is provided on the gate insulating film 44 and between the adjacent S/D diffusion regions 60b and 60c. The $SiO_2$ insulating film 46 is provided on the surface of the gate electrodes 26 and 28, the surfaces of the S/D diffusion regions 60a to 60c and the substrate contact region 64. Further, the insulating film 48 is provided on the insulating film 46 and the field oxide film 40. The regions 30s at which the contact holes are to be formed in the laminated insulating films 46 and 48 are predetermined on the S/D diffusion regions 60a to 60c.

A process for producing the gate array device of the present embodiment may be the same as the process for the conventional device described before.

As illustrated in FIG. 6A, each of the substrate contact regions 62 has narrower portions 62b of a width $w_2$ and wider portions 62a of a width $w_3$. As described before, the contact hole forming regions on the substrate contact regions 62 are provided under only the second interconnecting channel $32_2$. That is, one substrate contact region 62 is provided with a single contact hole forming region $30s_1$ at the portion 62a which is used for the substrate contact. Therefore, the width $w_3$ of the portion 62a is almost the same as the width $w_1$ of each of the substrate contact regions 18a shown in FIG. 2. For example, the width $w_3$ is approximately 4 ($\mu$m) in the case where a 2 ($\mu$m)×2 ($\mu$m) rectangular contact hole is to be formed. That is, the portion 62a is provided with a margin of approximately 2 ($\mu$m) for permitting the positional displacement of the contact hole which is formed at the contact hole forming region $30s_1$ within a predetermined tolerance. The portions 62b are made narrower than the portion 62a, because the portions 62b are not provided with the contact hole forming regions 30s. In other words, the contact holes for the substrate contact are not formed on the portions 62b. The width $w_2$ of the portion 62a can be set equal to be approximately 1.5 ($\mu$m) to 2.0 ($\mu$m) in the case where the portions 62b has the width $w_3$ of approximately 4 ($\mu$m). In principle, the width $w_2$ of the portions 62b may be made narrower without a specific limit.

The distance d between the edges of the contact hole forming regions 30s under the interconnecting channels other than the second channel $32_2$ and the edges of the S/D diffusion regions 58a and 58c is greater than the distance $d_0$ shown in FIG. 2. This is because the substrate contact region 62 is made narrow at its portions 62b, compared to the conventional diffusion region 18a. A distance $t_1$ between the edges of the S/D diffusion regions 58a and 58c and the substrate contact region 62 must be determined from the viewpoint of the accuracy (tolerance) of the alignment of mask layers for the substrate contact region 62 and the S/D diffusion regions 58a to 58c. For example, the distance $t_1$ approximately 2 ($\mu$m) is necessitated. An extended length corresponding to $d-d_0$ can be set equal to approximately 0.5 ($\mu$m) or more.

In order to obtain the appropriate value of the distance $t_1$ under the second interconnecting channel $32_2$, the edges of the S/D diffusion regions 58a and 58c are recessed under the channel $32_2$. The recessed portions are substantially of a trapezoid shape. Instead, a rectangular or curved configuration of the recessed portions may be used. Hence, the distance $d_p$ is smaller than the distance d. That is, portions of the S/D diffusion regions 58a and 58c under the second interconnecting channel $32_2$ are narrower than those thereof under the first, third and fourth interconnecting channels $32_1$, $32_3$ and $32_4$. Further, when comparing the distances $d_p$ and d with the distance $d_0$ for the conventional basic cell shown in FIG. 2, the following relationship can be obtained:

$$d_p < d_0 < d.$$

The interconnecting channel for the substrate contact is made by only the second interconnecting line $32_2$. In this regard, it seems that the degree of flexibility of the design of the interconnecting channel for the substrate contact is less than that for the conventional basic cell. However, it is noted that serious problems in the routing of interconnections would not arise at the time of designing logic circuits, and the limitation on the interconnecting line for the substrate contact would not decrease the practicability. It should be appreciated that the present invention results in advantages which far outweight the limitation of the interconnecting channels that can be utilized for the substrate contact.

In addition, the width of the substrate contact region 62 can be made narrower, and thereby the integration density of the gate array employing the above basic cells can be improved.

The p-channel side II has the features identical to those of the n-channel side I described above. As illustrated in FIG. 5, the n-channel and p-channel element regions 42n and 42p have a reflection relationship with respect to an imaginary boundary thereof.

An example of interconnecting patterns which can be performed on the structure shown in FIG. 5 is shown in FIG. 6A. In the depicted example, the S/D diffusion regions 58a and 58c adjacent to the substrate contact regions 62 are used as the drain regions, and the S/D diffusion region 58b is used as the source region. An interconnecting line 66 for the substrate contact is arranged on the second interconnecting channel $32_2$. The interconnecting line 66 is electrically coupled with the substrate contact regions 62 through contact holes 31a and 31c and with the source region 58b through a contact hole 31b. It is noted that contact holes are not formed in the insulating films 46 and 48 under the second interconnecting channel $32_2$ in the drain regions 58a and 58c. Therefore, problems arising from the positional displacement of the contact holes do not occur with respect to the interconnecting line 66 for the substrate contact. Another interconnecting line 68 is provided on the third interconnecting channel $32_3$.

An elevational cross sectional view of the interconnecting line 68 is shown in FIG. 6B. As shown, the width $w_2$ of the substrate contact region 62 is made narrower, as described before. The decrease in the width $w_2$ of the substrate contact region 62 makes it possible to extend the S/D diffusion regions 58a and 58c, as described before. The interconnecting line 68 is electrically connected to the drain regions 58a and 58c through contact holes 31d and 31e which are formed in the laminated insulating films 46 and 48. A reference numeral 72 shown in FIG. 6B denotes a correct position of the contact hole 31d. When the window opening is carried out accurately, the contact hole 31d is formed at a position specified by the reference numeral 72. The illustrated contact hole 31d is formed in a state where it deviates from the correct position by a distance $\Delta$. It is appreciated that the contact hole 31d is located within the surface of the drain region 58a made of the n+-type diffusion region. As a result, the short circuit between the interconnecting line 68 and the p-type well region 34 can be avoided. In addition, the compensated impurity diffusing process is not needed.

Figure 7A:
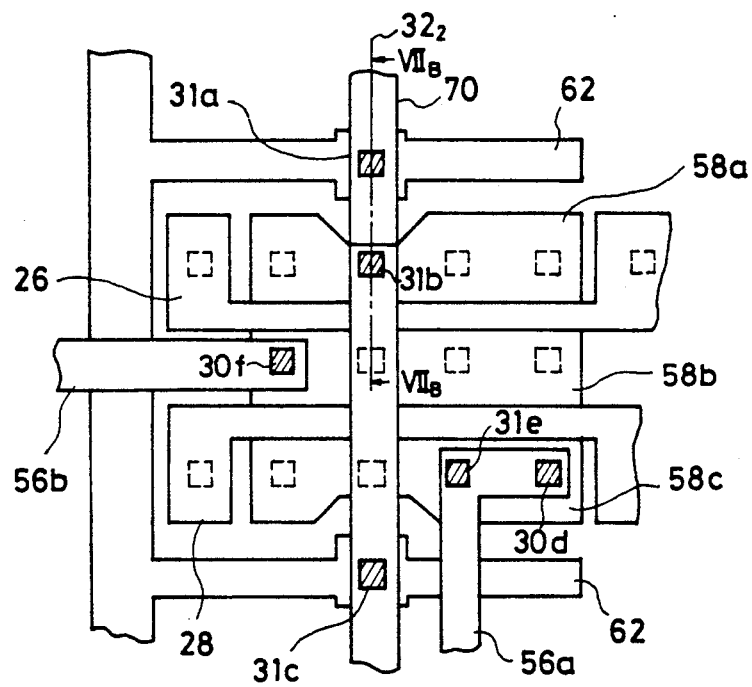
FIG. 7A is a plan view of the preferred embodiment of the basic cell shown in FIG. 5, in which interconnecting lines which are different from those shown in FIG. 5 are provided.

FIG. 7A shows another interconnecting pattern. The illustrated pattern itself is the same as those shown in FIG. 4A. Therefore, the S/D diffusion regions 58a and 58c are used as the source regions, and the S/D diffusion region 58b is used as the drain region. An interconnecting line 70 for making the substrate contact is arranged on the second interconnecting channel $32_2$. The interconnecting line 70 is electrically connected to the substrate contact regions 62 through the contact holes 31a and 31c and with the source region 58a through the contact hole 31b. The source region 58a is provided with a potential equal to the potential at the substrate contact region 62. The other source region 58c is connected to an interconnecting line 56a, the potential of which is different from that for the source region 58a. Still another interconnecting line 56b is electrically connected to the drain region 58b.

Figure 7B:
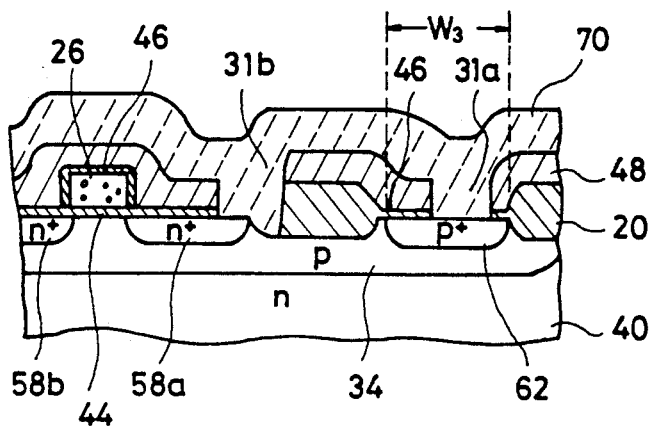
FIG. 7B is an elevational cross sectional view taken along a line VII$_B$—VII$_B$ shown in FIG. 7A.

FIG. 7B is an elevational cross sectional view taken along a lime $VII_B-VII_B$ shown in FIG. 7A. As shown, the contact holes are located partially beyond the source region 58a due to the large positional displacement. However, the problem of the short circuit does not arise because the source region 58a is designed so as to be connected to the substrate contact region 62 by the interconnecting line 70.

The present invention is not limited to the above embodiments, but various variations and modifications may be made without departing from the scope of the present invention.

Figure 8A:
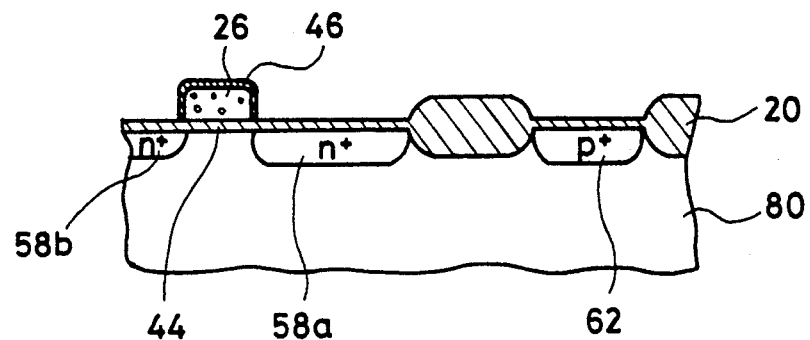
FIGS. 8A and 8B are elevational cross sectional views of n-channel and p-channel element regions which may be used in the present invention.
Figure 8B:
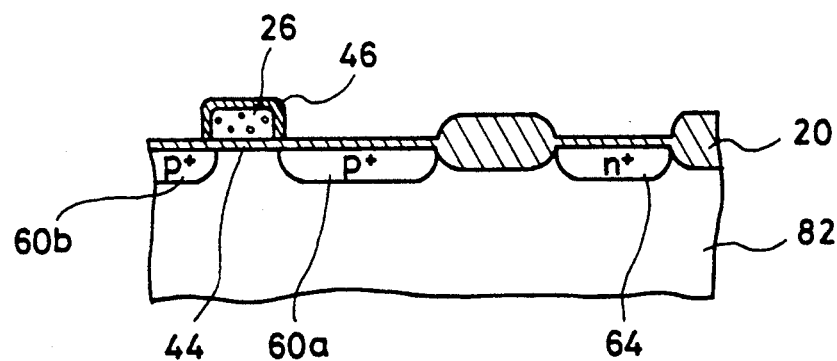

FIGS. 8A shows an elevational cross section of an n-channel element region, and FIG. 8B shows an elevational cross section of a p-channel element region. In these figures, insulating film and interconnecting lines are omitted for simplicity. In the above embodiments, a reference numeral 80 corresponds to the p-type well region 34 in the n-type substrate 40, and a reference numeral 82 corresponds to the n-type substrate 40. However, the present invention is not limited to these configurations of the CMOS gate array device. For example, the regions 58a to 58c and 62 of the n-channel element shown in FIG. 8A may be formed in a p-thpe substrate, or a p-type well region formed in a p-type substrate. The regions 60a to 60c and 64 of the p-channel element shown in FIG. 8B may be formed in an n-type well in an n-type substrate, or an n-type well region in a p-type substrate.

The interconnecting channels for making the substrate contact are not limited to the second interconnecting channel 32₂, but the other channels may be utilized. The number of the interconnecting channels is not limited to four, but a different number of the interconnecting channels may be used. The number of the transistors in each of the n-channel and p-channel element regions is not limited to two, and a different number of transistors may be provided.

What is claimed is:

1. A basic cell of a gate array device comprising:
   a substrate;
   a plurality of diffusion regions formed in the substrate and extending in parallel relationship in a first direction and aligned in at least one column in a second, transverse direction, each column comprising at least two sets of diffusion regions disposed in spaced relationship in the second direction, each set comprising at least two adjacent diffusion regions and each said diffusion region serving as a source or a drain;
   at least one gate electrode extending in the first direction within the column and located between the adjacent diffusion regions of a corresponding said set thereof;
   a substrate contact region formed in the substrate and including plural portions extending in parallel relationship in the first direction and in spaced relationship in the second direction and aligned within each said column, and thereby adjacent to but spaced from respective, corresponding diffusion regions of the sets thereof;
   an insulating film formed on the diffusion regions and each gate electrode and having contact hole forming regions at which contact holes are to be formed, the contact holes extending through the insulating film to the substrate, the contact hole forming regions being respectively associated with and aligned so as to define plural interconnecting channels extending in the second direction and including, for each said column, plural first interconnecting channels through the associated contact hole forming regions of which first contact holes may be selectively formed to provide ohmic contacts to respective said diffusion regions, and a second interconnecting channel through the associated contact hole forming regions of which second contact holes may be selectively formed to provide contacts to respective said substrate contact region portions; and
   each said corresponding diffusion region having first portions underlying the plural first interconnecting channels which are of a first width in the second direction, and a second portion underlying the second interconnecting channel which is of a second width, less than the first width, in the second direction.

2. The basic cell of a gate array device as claimed in claim 1, wherein:
   within each said column, each of said plural interconnecting channels includes plural first contact hole forming regions respectively aligned with said plurality of diffusion regions, the first contact hole forming regions of said plural interconnecting channels associated with a common diffusion region having commonly oriented, respective edges aligned in the first direction; and
   the edge of each said corresponding diffusion region adjacent to but spaced from a respective substrate contact region comprising first edge portions corresponding to said first diffusion region portions and a second edge portion corresponding to said second diffusion region portion, the first edge portion being spaced from the commonly oriented edges of the first contact hole forming regions associated with the diffusion region by a first predetermined distance (d) in the second direction and the second edge portion being spaced therefrom by a smaller, predetermined distance ($d_p$) in the second direction.

3. A basic cell of a gate array device as claimed in claim 1, wherein each said substrate contact region portion has a wider dimension, in the second direction, in the section thereof underlying the second interconnecting channel and a narrower dimension, in the second direction, in at least all remaining sections thereof respectively underlying the first interconnecting channels.

4. A basic cell of a gate array device as claimed in claim 1, wherein:
   said plurality of diffusion regions are aligned in first and second parallel columns, said first column comprising at least one n-channel element region and said second column comprising at least one p-channel element region, each said element region comprising plural diffusion regions, at least one gate electrode and at least one said substrate contact region portion and an insulating film thereon.

5. A basic cell of a gate array device as claimed in claim 4, wherein at least one n-channel metal oxide semiconductor transistor is formed in the n-channel element region, and at least one p-channel metal oxide semiconductor transistor is formed in the p-channel element region.

6. A basic cell of a gate array device as claimed in claim 5, wherein:
   said substrate is of the n-type;
   the n-channel element region comprises $n^+$-type diffusion regions formed in a p-type well region, in turn formed in the n-type substrate, and the substrate contact region associated therewith is a p+-type diffusion region formed in the p-type well region; and the p-channel element region comprises p+-type diffusion regions formed in the n-type substrate and the substrate contact region of the p-channel element region is an n+-type diffusion region formed in the n-type substrate.

7. A basic cell of a gate array device as claimed in claim 5, wherein:

each of the n-channel and p-channel element regions has associated therewith a plurality of said first interconnecting channels and a single, said second interconnecting channel.

8. A basic cell of a gate array device as claimed in claim 5, wherein a plurality of metal oxide transistors is formed in each of the n-channel and p-channel element regions.

9. A basic cell of a gate array device as claimed in claim 5, wherein the number of the contact hole forming regions at which the contact holes are to be formed for each of the diffusion regions corresponds to the number of the interconnecting channels.

10. A basic cell of a gate array device as claimed in claim 1, wherein:

at least one second contact hole is formed in a substrate contact hole forming region associated with said second interconnecting channel; and a further contact hole is made through a contact hole forming region of the insulating film associated with said second interconnecting channel to afford only contact to one of said diffusion regions, thereby to permit electrical interconnection of said one of said diffusion regions and said substrate contact region for setting the potential of said one of said diffusion regions equal to that of said substrate.

* * * * *

UNITED STATES PATENT AND TRADEMARK OFFICE
CERTIFICATE OF CORRECTION

PATENT NO. : 5,031,018

DATED : July 9, 1991

INVENTOR(S) : SHIRATO et al.

It is certified that error appears in the above-identified patent and that said Letters Patent is hereby corrected as shown below:

On title page, item

[75] Inventors, change "Kawasake" to --Kawasaki--.

[57] ABSTRACT, line 7, change "insulation" to --insulating--;
line 16, change "one" to --a--.

Col. 1, line 11, delete "a" (first occurrence);
line 15, after "form of" insert --a--;
line 18, change "designers," to --designers'--.

Col. 4, line 42, after "form" insert --,--, and after "define" insert --,--.

Col. 5, line 61, delete "the" (first occurrence).

Col. 8, line 8, change "similarly" to --Similarly--;
line 9, change "region" to --regions--.

Col. 9, line 33, change "necessiated" to --necessitated--.

UNITED STATES PATENT AND TRADEMARK OFFICE
CERTIFICATE OF CORRECTION

PATENT NO. : 5,031,018

DATED : July 9, 1991

INVENTOR(S) : Shirato et al

It is certified that error appears in the above-identified patent and that said Letters Patent is hereby corrected as shown below:

Col. 10,    line 67, change "lime" to --line--.

Col. 11,    line 10, change "FIGS." to --FIG.--;
                    line 21, change "p-thpe" to --p-type--.

Signed and Sealed this

Thirteenth Day of July, 1993

Attest:

MICHAEL K. KIRK

*Attesting Officer*      *Acting Commissioner of Patents and Trademarks*